United States Patent
Gogg et al.

(10) Patent No.: US 6,686,297 B1
(45) Date of Patent: Feb. 3, 2004

(54) METHOD OF MANUFACTURING A SEMICONDUCTOR DEVICE AND APPARATUS TO BE USED THEREFORE

(76) Inventors: Georg Gogg, Hofanger 1, D-85652 Pliening (DE); Dirk Maarten Knotter, Prof. Holstlaan 6, 5656 AA Eindhoven (NL); Charlene Reaux, 322 Lake Hazeltine Dr., Chaska, MN (US) 55318; Steve Nelson, 322 Lake Hazeltine Dr., Chaska, MN (US) 55318

( * ) Notice: Subject to any disclaimer, the term of this patent is extended or adjusted under 35 U.S.C. 154(b) by 143 days.

(21) Appl. No.: 09/640,736

(22) Filed: Aug. 17, 2000

(51) Int. Cl.⁷ ............................................. H01L 21/302
(52) U.S. Cl. ...................... 438/745; 438/747; 438/748; 438/749
(58) Field of Search ................................ 438/745, 748, 438/706, 749, 704, 747; 134/1.3

(56) References Cited

U.S. PATENT DOCUMENTS

| | | | |
|---|---|---|---|
| 5,971,368 A | * 10/1999 | Nelson et al. | 261/64.3 |
| 6,235,641 B1 | 5/2001 | Christenson | 438/706 |
| 6,240,933 B1 | * 6/2001 | Bergman | 134/1.3 |
| 6,273,108 B1 | 8/2001 | Bergman et al. | 134/102.1 |
| 6,274,506 B1 | * 8/2001 | Christenson et al. | 438/748 |
| 6,299,696 B2 | * 10/2001 | Kamikawa et al. | 134/2 |
| 6,399,513 B1 | * 6/2002 | Murphy et al. | 438/725 |

FOREIGN PATENT DOCUMENTS

| | | |
|---|---|---|
| EP | 0548596 A2 | 6/1993 |
| EP | 0959390 A1 | 11/1999 |
| WO | 9950898 A1 | 10/1999 |
| WO | 9952654 A1 | 10/1999 |

* cited by examiner

Primary Examiner—Benjamin L. Utech
Assistant Examiner—Binh X. Tran
(74) Attorney, Agent, or Firm—Aaron Waxler

(57) ABSTRACT

A method of manufacturing an electronic device, in particular but not exclusively a semiconductor device, in which method a substrate (2) is placed inside a process chamber (1) and a surface (3) of the substrate (2) is subjected to an ozone treatment comprising the steps of: providing a liquid onto the surface (3) of the substrate (2) via first supply means, introducing a solution comprising a liquid carrier solvent and ozone gas into the process chamber (1) via second supply means, without bringing about direct contact between the solution and the surface (3) of the substrate (2).

11 Claims, 1 Drawing Sheet

METHOD OF MANUFACTURING A SEMICONDUCTOR DEVICE AND APPARATUS TO BE USED THEREFORE

This invention relates to U.S. patent application Ser. No. 09/613,231.

BACKGROUND OF THE INVENTION

The invention relates to a method of manufacturing an electronic device, in particular but not exclusively a semiconductor device, in which method a substrate is placed inside a process chamber and a surface of the substrate is subjected to an ozone treatment.

Ozone gas is suitably applied in a variety of removal applications, such as the removal of organic materials including photoresists and organic contaminants, the removal of metals, salts of metals, particles, and the removal of oxide and regeneration of a controlled chemical oxide. The ozone gas is usually delivered into the process chamber either via an ozonated liquid, which is dispensed onto the surface of the substrate (method A), or via an ozone containing gas whereby an ozone free liquid/vapor is dispensed onto the surface of the substrate (method B). The ozonated liquid, which is a liquid with ozone gas dissolved in it, can be obtained by injection of an oxygen/ozone gas mixture generated by an ozone gas generator into the liquid. In order to specifically target certain contaminants and/or to enhance the effectiveness of the treatment by means of e.g. pH adjustment, the ozonated liquid of method A and the ozone free liquid/vapor of method B are advantageously applied with additives. Such ozone treatment methods as well as mixed forms thereof are disclosed in e.g. WO 99/50898, WO 99/52654, EP 0 959 390, EP 0 548 596.

A disadvantage of method A is that the liquid can not be heated at a high temperature, such as for example 80° C., as such a high temperature adversely affects the solubility of the ozone gas and, hence, the ultimate ozone gas concentration inside the process chamber. A high temperature is desired, as it increases the temperature of the substrate and, hence, promotes the reaction kinetics at the surface of the substrate. Moreover, the choice of additives is limited to those additives that are compatible with the ozone gas. For example, ammonium hydroxide can not be comprised in a large concentration without leading to a premature destruction of the ozone gas. Both aspects limit the removal rate at the surface of the substrate.

A disadvantage of method B is that the percentage of ozone gas in the oxygen/ozone gas mixture generated by the ozone gas generator can not be substantially higher than about 10%, which limits the ultimate ozone gas concentration inside the process chamber and, hence, the removal rate at the surface of the substrate. A high ozone gas concentration inside the process chamber is desired, as it promotes the reaction kinetics at the surface of the substrate.

SUMMARY OF THE INVENTION

The invention has inter alia for its object to provide a method of the kind mentioned in the opening paragraph, in which method the performance of the ozone treatment is improved.

The ozone treatment of the method in accordance with the invention comprises the steps of:
  providing a liquid onto the surface of the substrate via first supply means,
  introducing a solution comprising a liquid carrier solvent and ozone gas into the process chamber via second supply means, without bringing about direct contact between the solution and the surface of the substrate.

As the ozone gas is supplied to the process chamber via a separate solution, the temperature of the liquid can be chosen freely without having an adverse effect on the solubility of the ozone gas. Hence, the liquid can now be applied at a high temperature, such as for example 80° C., without thereby limiting the concentration of ozone gas that is obtainable inside the process chamber. By using a solution comprising a liquid carrier solvent and ozone gas dissolved in it instead of an oxygen/ozone gas mixture, the percentage of ozone gas can be substantially higher than about 10%. Moreover, as the ozone gas is supplied to the process chamber via a separate solution, the choice of additives is not limited to those additives that are compatible with the ozone gas. For example, ammonium hydroxide can now be comprised in the liquid in a large concentration without leading to a premature destruction of the ozone gas.

In one embodiment of the method in accordance with the invention, the solution comprising the liquid carrier solvent and the ozone gas is dispensed onto a turntable thereby releasing ozone gas, which turntable is separated from the substrate and is used for rotating the substrate. By dispensing the solution onto a moving part of the process chamber instead of a stationary part of the process chamber, the release of ozone gas from the solution is promoted. In this way, a higher ozone gas concentration inside the process chamber can be reached.

Further advantageous embodiments of the method in accordance with the invention are described in the other dependent claims. The invention further relates to an apparatus for subjecting a surface of a substrate, in particular but not exclusively a semiconductor substrate, to an ozone treatment.

Such an apparatus is disclosed in e.g. WO 99/50898, WO 99/52654, EP 0 959 390, EP 0 548 596.

In order to improve the performance of the ozone treatment, the apparatus in accordance with the invention comprises:
  a process chamber for accommodating the substrate,
  heating means for heating the substrate,
  first supply means for providing a liquid onto the surface of the substrate,
  second supply means for introducing a solution comprising a liquid carrier solvent and ozone gas into the process chamber without bringing about direct contact between the solution and the surface of the substrate.

Further advantageous embodiments of the apparatus in accordance with the invention are described in the other dependent claims.

BRIEF DESCRIPTION OF THE DRAWING

These and other aspects of the invention will be apparent from and be elucidated with reference to the embodiments described hereinafter and shown in the drawing. In the drawing.

DESCRIPTION OF THE PREFERRED EMBODIMENTS

Figure 1:
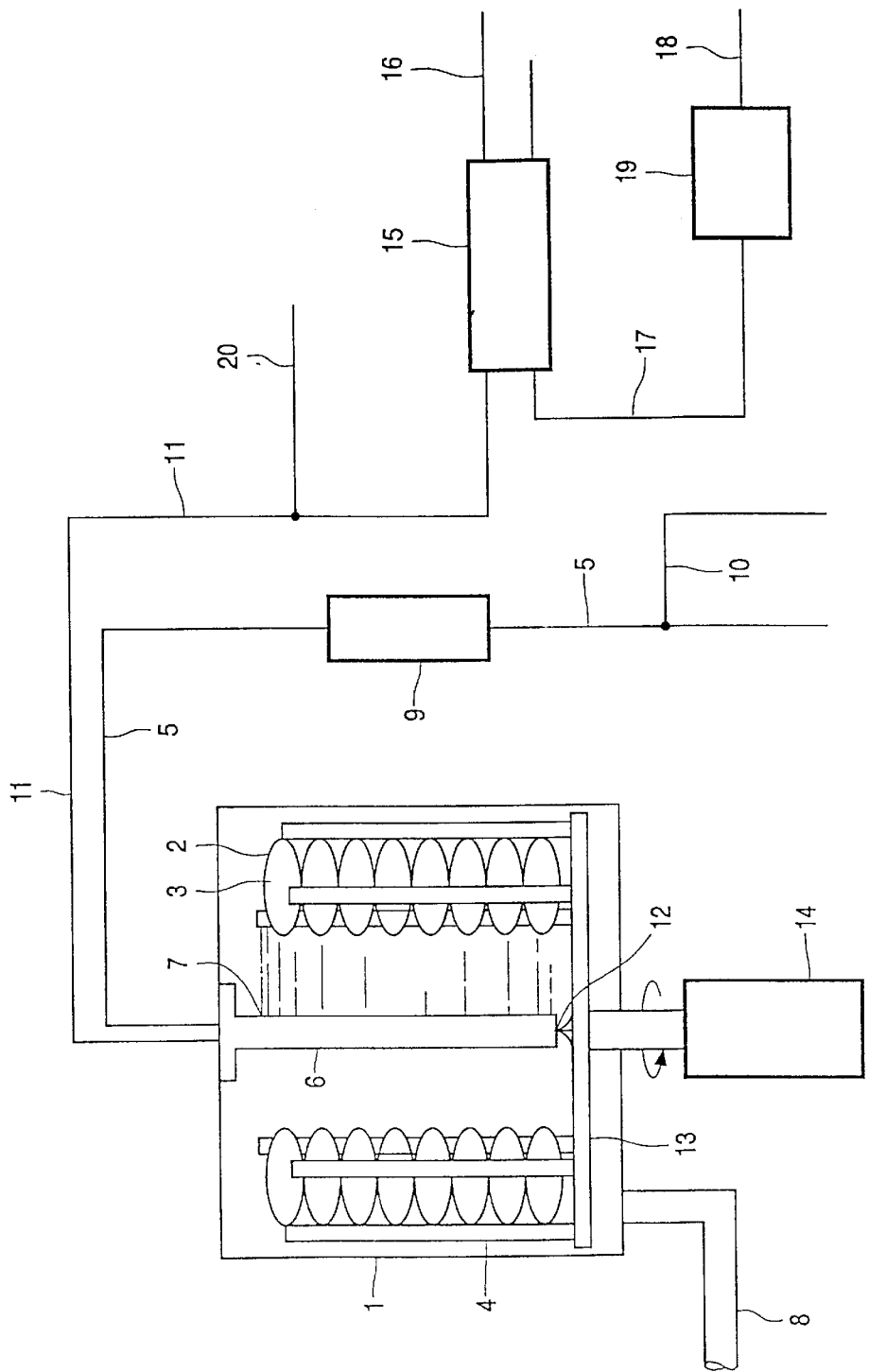
FIG. 1 shows in diagrammatic view the apparatus in accordance with the invention.

An apparatus for subjecting a surface 3 of substrates 2 to an ozone treatment is shown schematically in FIG. 1, the apparatus comprising a process chamber 1 for accommodating the substrates 2. In the present example, the process chamber 1 is designed such that a large number of substrates 2 can be treated simultaneously by stacking the substrates 2 in cassettes 4. Alternatively, the apparatus may comprise a process chamber 1 designed to treat one substrate 2 a time.

A liquid is supplied to the process chamber 1 via supply line 5, which liquid is then provided onto the surface 3 of the substrates 2 to form a liquid film thereon. In order to provide the liquid as micro-droplets thereby resulting in a thin liquid film, the liquid is advantageously sprayed. For this purpose, the supply line 5 terminates in a spray post 6, from which spray post 6 the liquid is sprayed laterally from a series of nozzles 7 onto the surface 3 of the substrates 2. The spray post 6 extends downward in the center of the process chamber 1 such that all the substrates 2 in the cassettes 4 may be sprayed with the liquid. The liquid may be sprayed using a continuous flow or a pulsed flow. Excessively supplied liquid leaves the process chamber I through a drain 8 positioned at the bottom of the process chamber 1.

The liquid may be provided onto the surface 3 of the substrates 2 while having a temperature close to or even below room temperature. However. in order to enhance the effectiveness of the treatment, the liquid is advantageously provided at a temperature well above room temperature. Heating of the liquid may be accomplished by means of a heater 9, which is disposed to heat the liquid before it enters the process chamber 1. Since the ozone gas is supplied to the process chamber I via a separate solution, as will be outlined later, the temperature of the liquid can be chosen freely without adversely affecting the solubility of the ozone gas. Hence, the liquid can now be applied at a high temperature, such as for example 80° C., without thereby limiting the concentration of ozone gas that is obtainable inside the process chamber 1.

Either pure deionized water or a solution of one or more additives in deionized water is advantageously applied as the liquid, but it will be recognized that other liquids, such as non-aqueous solutions, may also be employed The deionized water is transported through the supply line 5. Prior to entering the process chamber 1, the deionized water may be mixed with one or more additives, which additives flow in via one or more supply lines 10. The deionized water, whether mixed with one or more additives or not, may be advantageously heated to a temperature between about 40° C. and 100° C., and more preferably to a temperature between about 60° C. and 90° C. In order to further enhance the effectiveness of the treatment, the deionized water may be heated to generate a supply of steam under pressure to the process chamber 1. Under such circumstances, it is possible to achieve temperatures at the surface of the substrates in excess of 100° C. Introduction of steam into the process chamber 1 will also result in formation of a thin liquid film on the surface 3 of the substrates 2.

Additives may be used to specifically target certain contaminants and/or to enhance the effectiveness of the treatment. For example, an acid, such as hydrofluoric acid (HF) or phosphoric acid ($H_3PO_4$), a base, such as ammonium hydroxide ($NH_4OH$), or a mixture of an acid and a base, may be used to adjust the pH of the liquid and, thereby, increase the effectiveness of the treatment. Ammonium hydroxide is often used as a base in standard semiconductor processes, as strong bases which contain metals, such as sodium hydroxide (NaOH) and potassium hydroxide (KOH), are not acceptable in such processes. Moreover, ammonium hydroxide ($NH_4OH$) may also be comprised in the liquid for particle and organic removal. In such a treatment, the ozone gas prevents pitting of silicon, if present, by the ammonium hydroxide. Other additives that enhance the cleaning capability of the treatment include hydrofluoric acid (HF) and hydrochloric acid (HCl). Such additives have the following benefits/effects: 1) removal of organic contaminants; 2) removal of oxide and regeneration of a controlled chemical oxide; 3) removal of particles; 4) removal of metals. So, depending on the treatment to be carried out, the liquid may be applied with one or more appropriate additives. Particles, metals and organics may be removed in separate treatments, but are advantageously removed in a concurrent manner in a single treatment. Since the ozone gas is supplied to the process chamber 1 via a separate solution, as will be outlined later, the choice of additives is not limited to those additives that are compatible with the ozone gas. For example, ammonium hydroxide can now be comprised in the liquid in quite a large concentration without leading to a premature destruction of the ozone gas.

Furthermore, a solution comprising a liquid carrier solvent and ozone gas is supplied to the process chamber 1 via supply line 11, which supply line 11 also terminates in the spray post 6 in the present example. For this purpose, the spray post 6 may be designed as a double-walled tube having an inner tube (not shown) in which the supply line 11 terminates and an outer flow-through region, which is bordered by the wall of the inner tube and the outer wall of the spray post 6, in which flow-through region the supply line 5 terminates. The outer wall of the spray post 6 may then be fitted with the nozzles 7 from which the liquid is provided (sprayed) onto the surface 3 of the substrates 2. The inner tube may then be provided with an opening 12 facing a turntable 13, which is used in conjunction with a motor 14 to rotate the cassettes 4 with the substrates 2. The solution is dispensed through the opening 12 onto the turntable 13, thereby releasing ozone gas from the solution into the gas phase, which ozone gas mixes in the process chamber 1. It is important to note that the solution is introduced into the process chamber 1 without bringing about direct contact between the solution and the surface 3 of the substrates 2. Clearly, the solution may also be introduced into the process chamber 1 via a separate tube instead of via a tube incorporated in the spray post 6. Moreover, the solution need not be dispensed on the turntable 13, but in principle may be dispensed on each part of the process chamber 1 that is separated from the substrates 2.

Deionized water is advantageously applied as the liquid carrier solvent, but it will be recognized that other liquids may also be employed While ozonated deionized water may be prepared by any suitable process known in the art. it is advantageously prepared by means of a gas/liquid contactor 15 of a parallel counter-flow design operating at elevated pressure, into which contractor 15 deionized water, or any other suitable liquid, is introduced at one end and an oxygen/ozone gas mixture is introduced at the opposite end. The deionized water and the oxygen/ozone gas mixture are supplied to the gas/liquid contactor 15 by respective supply lines 16 and 17.

First, oxygen gas ($O_2$) is supplied via supply line 18 to an ozone gas generator 19, inside of which ozone gas generator 19 an electric field is used to dissociate the oxygen gas at an elevated pressure. About 20% of the resultant oxygen atoms will combine to form ozone gas ($O_3$). The resultant oxygen/ozone gas ($O_2/O_3$) mixture is subsequently fed to the gas/liquid contactor 15 via the supply line 17. Simultaneously, deionized water is fed to the gas/liquid contactor 15 via the supply line 16. The gas liquid contactor 15 consists of small-diameter, thin-wall tubes through which the deionized water flows while the oxygen/ozone gas mixture surrounds the tubes. The oxygen/ozone gas mixture diffuses through the thin walls of the tubes and dissolves in the deionized water. By pressurizing the gas/liquid contactor 15 during the dissolution of the oxygen/ozone gas mixture, an increased concentration of dissolved ozone gas in deionized water can be obtained. The temperature of the deionized water can be reduced freely to a value between, for example, about 5° C.

and 20° C. during the dissolution of the oxygen/ozone gas mixture in order to further increase the solubility of the ozone gas in the deionized water. As the ultimate solution is introduced into the process chamber 1 without having direct contact with the surface 3 of the substrates 2, the temperature of the substrates 2 will not be lowered. The deionized water that has now ozone gas dissolved in it leaves the gas/liquid contactor 15 and is subsequently supplied to the process chamber 1 via the supply line 11. A sample of some of the ozonated water may be supplied to a sensor (not shown) for measurement of the dissolved ozone gas concentration. The undissolved oxygen/ozone gas exiting the gas/liquid contactor 15 may be optionally supplied to the process chamber 1 to minimize gas losses and further increase the ozone gas concentration prevailing in the process chamber 1.

After leaving the gas/liquid contactor 15, the solution comprising the liquid carrier solvent, in the present example deionized water, and the ozone gas is advantageously mixed with an ozone gas stabilizing agent to suppress destruction of the ozone gas prior to its release into the gas phase and, hence, to enhance the effectiveness of the treatment This ozone gas stabilizing agent may flow in via supply line 20. Bicarbonate and/or carbonate ions are advantageously applied as the ozone gas stabilizing agent, although other ozone gas stabilizing agents may also be used, such as acetone, acetic acid, $HPO_4^{2-}$ (hydrogen phosphate ions) and salts thereof, $H_3PO_4$, $NH_4H_2PO_4$, $(NH_4)_2HPO_4$, salts of $PO_4^-$ and alkanes. The bicarbonate ions may be derived from salts of bicarbonate ions including $NH_4HCO_3$, salts of carbonate ions, dissolved $CO_2$ in solution, or combinations of these bicarbonate ion sources. In practical terms, salts which include metals such as sodium are in general not acceptable for semiconductor applications, as this could lead to deposition of trace levels of metals on the semiconductor substrates. Thus, ammonia and other non-metallic cations are advantageously applied as the counter-ion when the source of bicarbonate ions is a salt of bicarbonate or carbonate.

As mentioned before, a thin liquid film is formed on the surface of the substrates. The liquid film is controlled through the use of a rotation speed, the flow rate of the liquid, and/or the injection technique (nozzle design) used to deliver the liquid to the surface of the substrates. The ozone gas that is released from the solution into the gas phase is able to diffuse through this liquid film and react at the surface of the substrate, whether silicon, photoresist, metal, etc., is exposed at the surface. The elevated temperature of the liquid and, hence, of the liquid film promotes the reaction kinetics, and the high ozone gas concentration in the gas phase promotes diffusion of the ozone gas through the liquid film even though the elevated temperature of the liquid film does not result in a high concentration of ozone gas dissolved in it.

So, the substrates 2 are advantageously heated indirectly by heating the liquid that is provided onto the surface 3 of the substrates 2 prior to entering the process chamber 1. For this purpose, the heater 9 is used. In order to achieve the thinnest possible liquid film on the surface 3 of the substrates 2, a pulsed flow of the liquid may be used. In instances in which such a pulsed flow fails to maintain the requisite elevated temperature of the substrates 2, an alternative or additional manner of heating the substrates 2 may be needed. To this end, the substrates 2 may be heated indirectly by, for example, one or more embedded heated recirculating coils, a heating blanket, or one or more infrared lamps (none of them shown). Furthermore, the release of ozone gas into the gas phase and, hence, the effectiveness of the treatment can be promoted by heating that part of the process chamber 1 onto which the solution is dispensed, in the present example the turn table 13.

The ozone treatment and apparatus described above can be advantageously applied for, for example, the removal of organic materials including photoresists and organic contaminants, the removal of metals, salts of metals, particles, and the removal of oxide and regeneration of a controlled chemical oxide.

Although the invention can be advantageously used in the manufacture of semiconductor devices, which are also referred to as active devices, it is also applicable for the benefit of passive devices such as, for example, thin-film capacitors and resistors. Besides to substrates comprising semiconductor bodies, which are commonly applied in the manufacture of semiconductor devices, the invention is also applicable to substrates comprising, for example, glass bodies or silicon-on-insulator (SOI) bodies. Glass bodies can be used in the manufacture of, for example, thin-film transistors and active arrays for driving liquid crystal displays (LCD's), whereas silicon-on-insulator (SOI) bodies can be used for high-frequency devices f e.g. telecom applications and high-voltage devices. In addition, the ozone treatment may be performed in a one-step process or may be repeated as often as necessary as part of a multi-step process. Moreover, the ozone treatment may be carried out in a so-called wet bench comprising a series of process chambers.

It will be apparent that the invention is not limited to the embodiments described above, but that many variations are possible to those skilled in the art within the scope of the invention.

What is claimed is:

1. A method of manufacturing an electronic device, in which substrate is placed inside a a process chamber and a surface of the substrate is subjected to an ozone treatment comprising the steps of:

providing a liquid onto the surface of the substrate via first supply means, introducing a solution comprising a liquid carrier solvent and ozone gas into the process chamber via second supply means, without bringing about direct contact between the solution and the surface of the substrate.

2. A method as claimed in claim 1, wherein the liquid is provided onto the surface of the substrate by spraying the liquid from at least one nozzle onto the surface of the substrate.

3. A method as claimed in claim 1, wherein the liquid is heated.

4. A method as claimed in claim 1, wherein deionized water is applied as the liquid.

5. A method as claimed in claim 1, wherein deionized water is applied as the liquid carrier solvent.

6. A method as claimed in claim 1, wherein the solution comprising the liquid carrier solvent and the ozone gas is dispensed onto a part of the process chamber separated from the substrate, thereby releasing ozone gas.

7. A method as claimed in claim 6, wherein a turntable for rotating the substrate is used as the part of the process chamber.

8. A method as claimed in claim 1, wherein the liquid is applied with at least one additive.

9. A method as claimed in claim 8, wherein an acid or a base is applied as the at least one additive to adjust the pH of the liquid.

10. A method as claimed in claim 1, wherein the solution comprising the liquid carrier solvent and the ozone gas is applied with an ozone gas stabilizing agent.

11. A method as claimed in claim 10, wherein bicarbonate and/or carbonate ions are applied as the ozone gas stabilizing agent.

* * * * *